(12) United States Patent
Chou et al.

(10) Patent No.: US 7,317,739 B2
(45) Date of Patent: Jan. 8, 2008

(54) MODE-LOCKED LASER USING A MODE-LOCKING WAVELENGTH SELECTIVE REFLECTOR

(75) Inventors: Stephen Y. Chou, Princeton, NJ (US); Shufeng Bai, Princeton, NJ (US); Allan Chang, Princeton, NJ (US); Hua Tan, Princeton, NJ (US); Jian Jim Wang, Orefield, PA (US)

(73) Assignee: Princeton University, Princeton, NJ (US)

( * ) Notice: Subject to any disclaimer, the term of this patent is extended or adjusted under 35 U.S.C. 154(b) by 166 days.

(21) Appl. No.: 10/390,379

(22) Filed: Mar. 17, 2003

(65) Prior Publication Data

US 2004/0008742 A1    Jan. 15, 2004

Related U.S. Application Data

(60) Provisional application No. 60/365,045, filed on Mar. 15, 2002.

(51) Int. Cl.
*H01S 3/098* (2006.01)
*H01S 3/08* (2006.01)

(52) U.S. Cl. ............................ 372/18; 372/92; 372/102

(58) Field of Classification Search ................ 372/18, 372/19, 20, 39, 43, 99, 102, 92
See application file for complete search history.

(56) References Cited

U.S. PATENT DOCUMENTS

| | | | | | |
|---|---|---|---|---|---|
| 4,554,666 | A | * | 11/1985 | Altman | 372/19 |
| 4,675,873 | A | * | 6/1987 | Miller | 372/19 |
| 5,136,596 | A | * | 8/1992 | Rao et al. | 372/20 |
| 5,233,620 | A | * | 8/1993 | Shinozaki et al. | 372/22 |
| 5,289,483 | A | * | 2/1994 | De Poorter et al. | 372/45 |
| 5,319,668 | A | * | 6/1994 | Luecke | 372/107 |
| 5,594,744 | A | * | 1/1997 | Lefevre et al. | 372/20 |
| 5,621,828 | A | * | 4/1997 | Baets et al. | 385/14 |
| 6,363,097 | B1 | * | 3/2002 | Linke et al. | 372/102 |
| 6,597,721 | B1 | * | 7/2003 | Hutchinson et al. | 372/98 |
| 6,621,847 | B1 | * | 9/2003 | Tada | 372/57 |
| 6,785,430 | B2 | * | 8/2004 | Paniccia | 385/10 |
| 2003/0231692 | A1 | * | 12/2003 | Belikov et al. | 372/102 |

* cited by examiner

*Primary Examiner*—Armando Rodriguez
(74) *Attorney, Agent, or Firm*—Polster, Lieder, Woodruff & Lucchesi

(57) ABSTRACT

In accordance with the invention, a mode-locked laser comprises an optical gain medium disposed within an optical cavity formed by a first reflector and a wavelength selective second reflector to achieve mode-locking operation. Advantageously, the wavelength reflective reflector is a two-dimensional subwavelength resonant grating. The resulting laser is compact, tunable, reliable and inexpensive. It provides high side mode suppression and high output power.

14 Claims, 9 Drawing Sheets

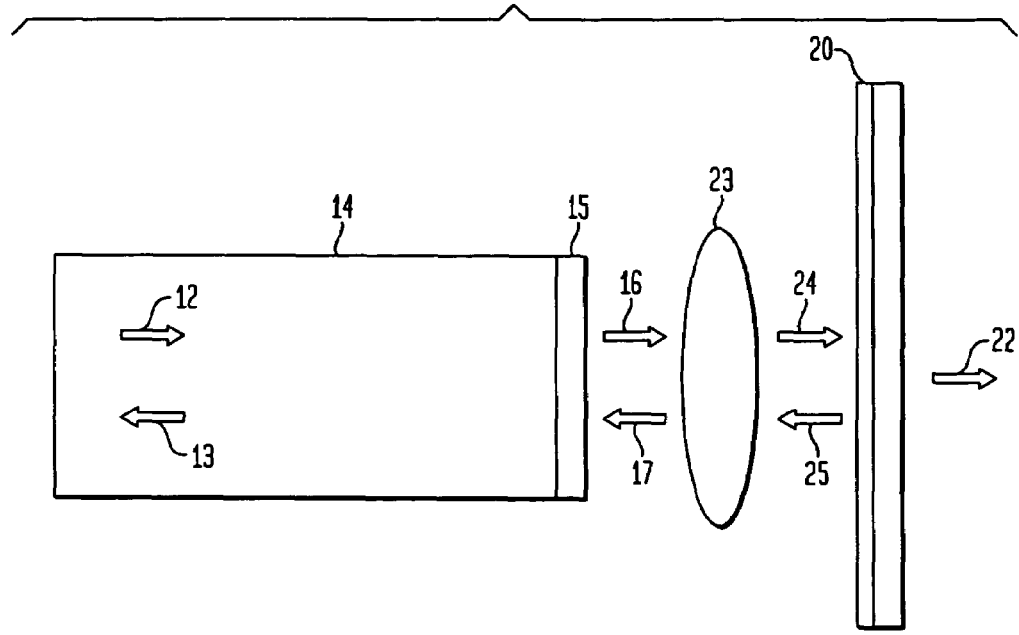
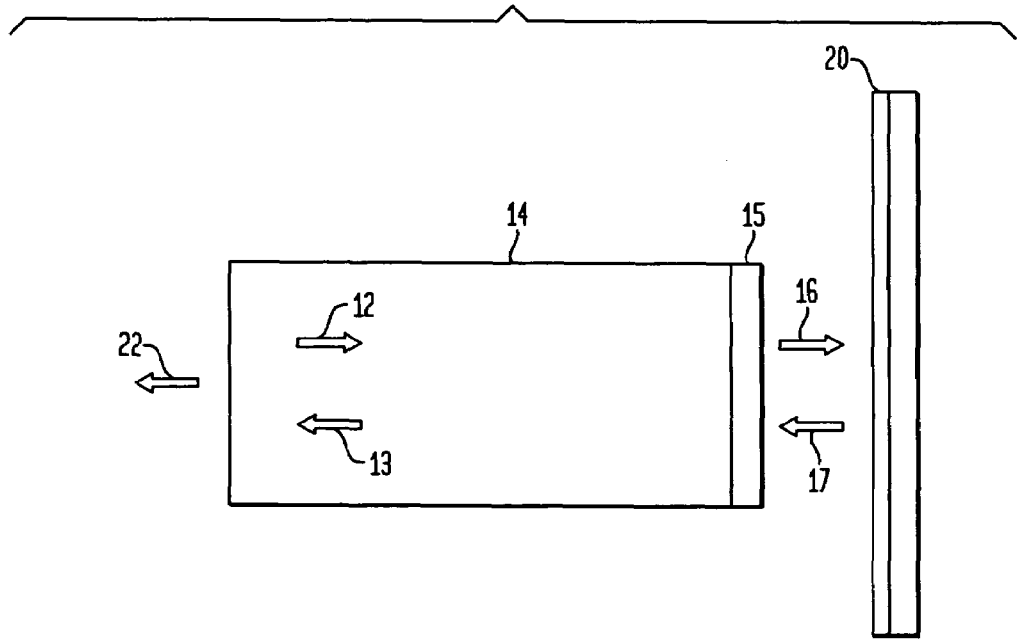

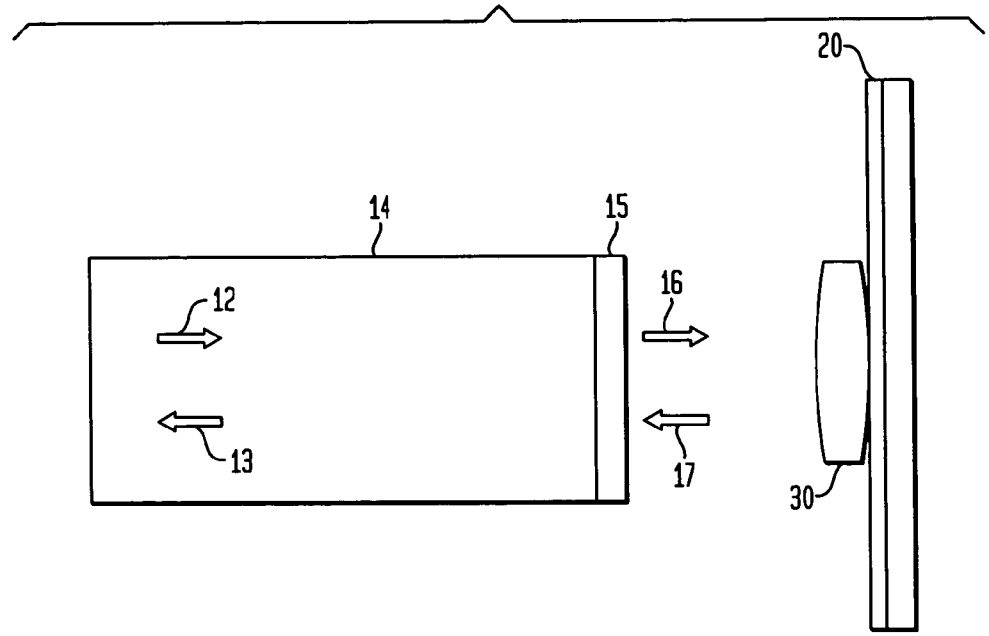
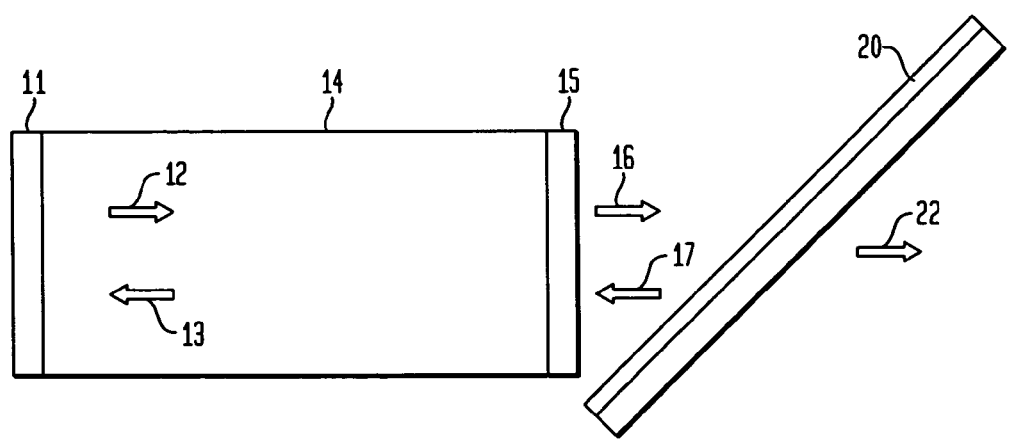

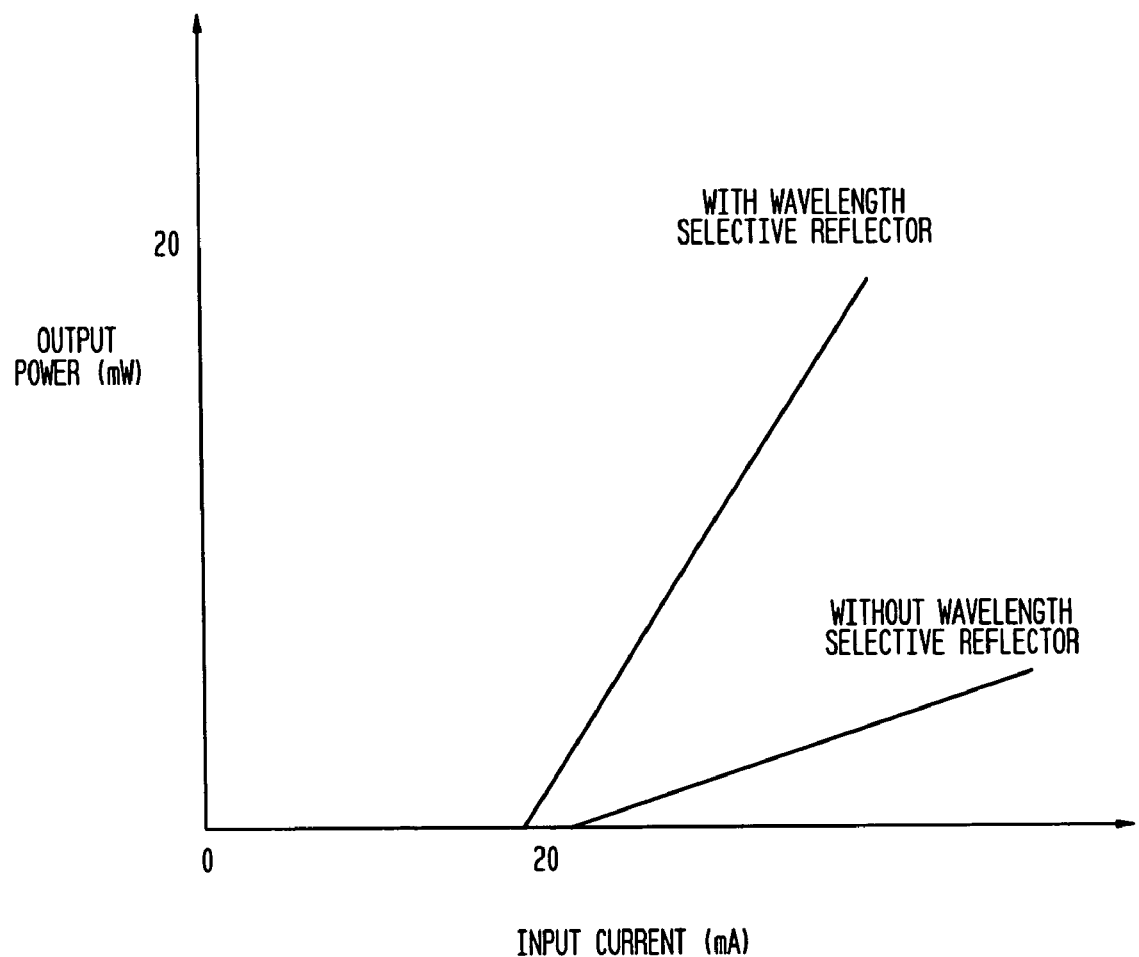

MODE-LOCKED LASER USING A MODE-LOCKING WAVELENGTH SELECTIVE REFLECTOR

CROSS REFERENCE TO RELATED APPLICATIONS

This application claims the benefit of U.S. Provisional Application Ser. No. 60/365,045 filed by the present applicants on Mar. 15, 2002 and entitled "A Mode Lock Laser Using a Wavelength Selective Reflector," which is incorporated herein by reference.

FIELD OF THE INVENTION

This invention relates to lasers and, in particular, to a mode-locked laser using a wavelength selective reflector to achieve mode locked operation.

BACKGROUND OF THE INVENTION

Lasers mode locked to a single mode of operation are important in a wide variety of applications such as optical fiber communications and optical test instruments. Indeed single mode lasers are almost indispensable to provide the stable, reliable signals needed in high speed optical communications.

Conventional practice is to use distributed feedback lasers (DFB lasers) for such applications. Unfortunately DFB lasers are difficult to fabricate. The fabrication process is complex, the yields are low and, as a consequence, the lasers are expensive. In addition the lasing wavelength of a DFB laser depends heavily on the ambient temperature and the injected current, presenting issues of output wavelength stability.

Accordingly there is a need for a compact, reliable, low-cost single-mode laser.

SUMMARY OF THE INVENTION

In accordance with the invention, a mode-locked laser comprises an optical gain medium disposed within an optical cavity formed by a first reflector and a wavelength selective second reflector to achieve mode-locking operation. Advantageously, the wavelength reflective reflector is a two-dimensional subwavelength resonant grating. The resulting laser is compact, tunable, reliable and inexpensive. It provides high side mode suppression and high output power.

BRIEF DESCRIPTION OF THE DRAWING

The advantages, nature and features of the invention will appear more fully upon consideration of the illustrative embodiments now to be described in detail in connection with the accompanying drawings. In the drawings:

FIG. 4 is an alternative configuration of the laser, in which collimation optics is used and no high-reflective coating is used;

FIG. 5 is an alternative configuration of the laser, in which no collimation optics and no high-reflective coating is used;

FIG. 6 is an alternative configuration of the laser, in which integrated collimation optics is used;

FIG. 7 illustrates a method to tune the wavelength of the output of the laser;

FIG. 15 shows the output power versus input current curve for the laser, with and without wavelength selective reflector.

It is to be understood that the drawings are for purposes of illustrating the concepts of the invention and, except for the graphs, are not to scale.

DETAILED DESCRIPTION

Figure 1A:
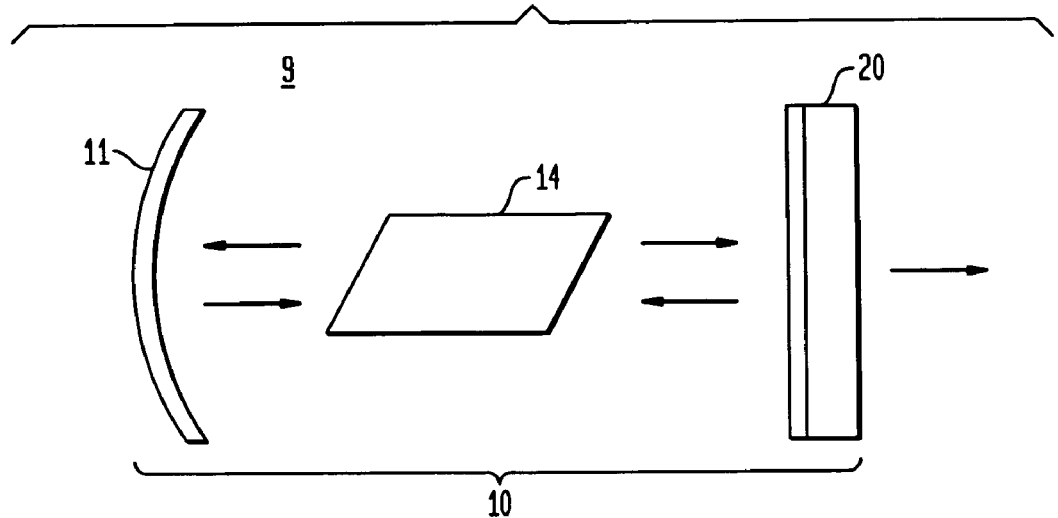
FIGS. 1A and 1B are schematics of exemplary mode-locked lasers in accordance with the invention.

Referring to the drawings, FIG. 1A schematically illustrates a mode-locked laser 9 comprising an optical gain medium 14 disposed within an optical cavity 10 formed by a first reflector 11 and a narrow band wavelength selection second reflector 20, such as a two-dimensional subwavelength resonant grating, to achieve mode-locking operation. By achieving mode-locking operation is meant that the wavelength selective reflector will selectively reflect only a sufficiently small bandwidth that laser operation will take place in only one longitudinal cavity mode.

By "two-dimensional subwavelength resonant grating" is meant that a grating comprising an array of spaced apart linear protruding features (lines) or an array of spaced apart projecting peaks (essentially points) arranged in a two dimensional array. The array of lines is two-dimensional because of the length of the lines in one dimension and the plurality of lines in the other dimension. The array of peaks is two-dimensional because there are pluralities of spaced apart peaks in first and second dimensions. By "subwavelength" is meant that the features (linewidth and transverse dimensions of peaks) as well as the spacings are all less than the wavelength of the light being processed. Advantageously the lines have nanoscale widths (less than a micrometer and preferably less than five hundred nanometers) and the peak features are nanoscale in all dimensions transverse to the direction of projection. Structures having the requisite small dimensions, fine spacing and uniformity are described and illustrated in U.S. Pat. No. 5,772,905 issued to Stephen Chou on Jun. 30, 1998 and entitled "Nanoimprint Lithography" and U.S. Pat. No. 6,482,742 issued to Stephen Chou on Nov. 19, 2002 and entitled "Fluid Pressure Imprint Lithography". The aforementioned '905 and '742 patents are incorporated herein by reference.

Figure 1B:
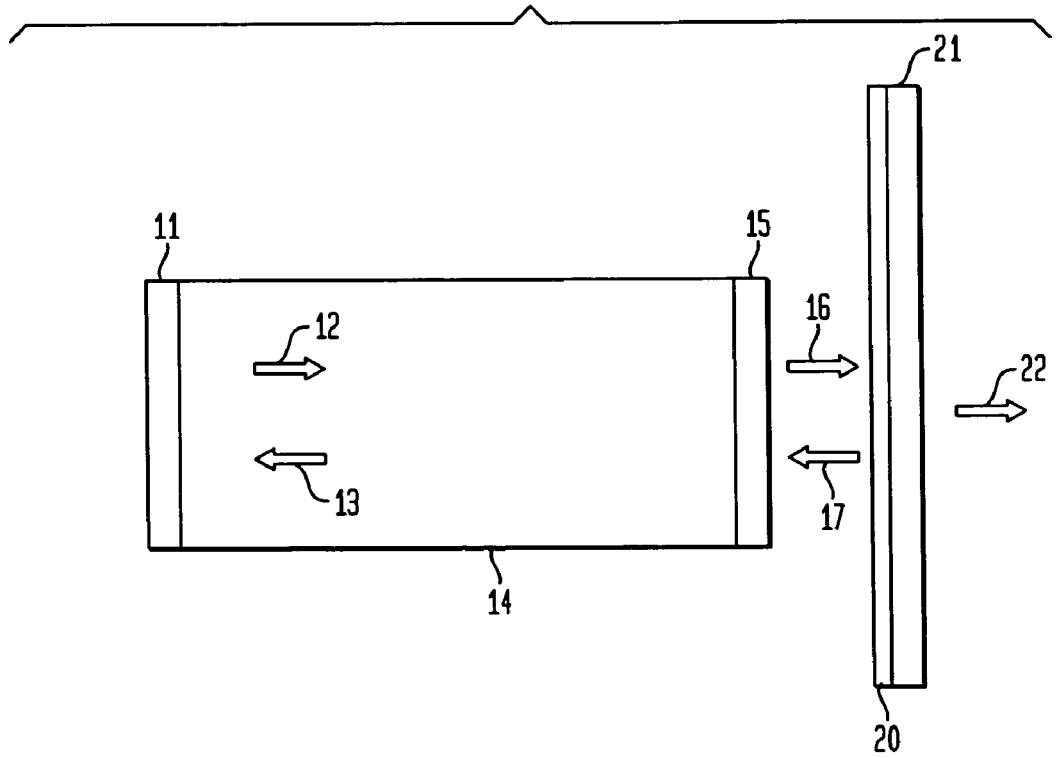

FIG. 1B illustrates a first advantageous embodiment of a FIG. 1A mode-locked laser. In this particular embodiment, the gain medium 14 is a laser diode. The first reflector 11 is a high reflective coating deposited on the back facet of the diode (near 100% reflectivity). Advantageously the other facet of the diode is coated with an antireflection coating 15. The grating reflector 20 is formed on a transparent substrate 21.

In operation the diode gain medium 14 is pumped by injecting current into the diode. When enough current is injected, the gain medium is pumped to a population inversion state. At this stage, light of wavelength reflected by grating reflector 20 builds up within the optical cavity 10. The light is generated in the gain medium, is collimated by the antireflection coating 15 and incident on the grating reflector 20. Light 17 reflected by the grating is reflected back into the gain medium where it is amplified (13) and reflected (12) from the reflector 11. Thus light of the grating selected wavelength is reflected back and forth within the optical cavity and undergoes successive amplifications to high intensity.

In contrast, light 22 of wavelengths not reflected by the grating passes through the grating and the transparent substrate 21 to leave the cavity. Thus the laser achieves single mode lasing at the wavelength selected by the grating.

The system thus utilizes a wavelength selective reflector to form an external cavity only for the desired wavelength, and produces single mode operation. The core of the system consists of the gain medium, collimation optics and wavelength selective reflector. In one of the embodiments, the gain medium is chosen to be an InGaAsP/InP multiple quantum well Fabry-Perot semiconductor laser, with one of the facets coated with anti-reflection coating. The collimation optics can be a ball lens, aspherical lens, or free space depending on the application requirements.

The wavelength selective reflector in this embodiment is a subwavelength resonant grating filter (or guided mode resonance filter, or waveguide-grating filter, in the literature). The reflector is put in front of the coated front facet of the diode and the collimation optics is in between them. Consider the cavity formed by the back facet and the reflector, the threshold of lasing depends on the confinement factor, material loss, the reflector loss and the coupling efficiency between the reflected mode and guided mode in the gain medium:

$$\gamma_{th} = \frac{1}{\Gamma}\left(\alpha + \frac{1}{2d}ln\left(\frac{1}{\eta R_{back} R_{ref}}\right)\right),$$

where $\gamma_{th}$ denotes the threshold gain, $\Gamma$ is the confinement factor, $\alpha$ is the gain medium absorption coefficient, d is the length of the gain medium, $\eta$ is the coupling coefficient describing how much of the reflected beam is coupled back into the guided mode of the gain medium, $R_{back}$ is the reflectance of the back facet, and $R_{ref}$ is the reflectance of the reflector.

Alternative embodiments are illustrated in the remaining drawings.

Figure 2:
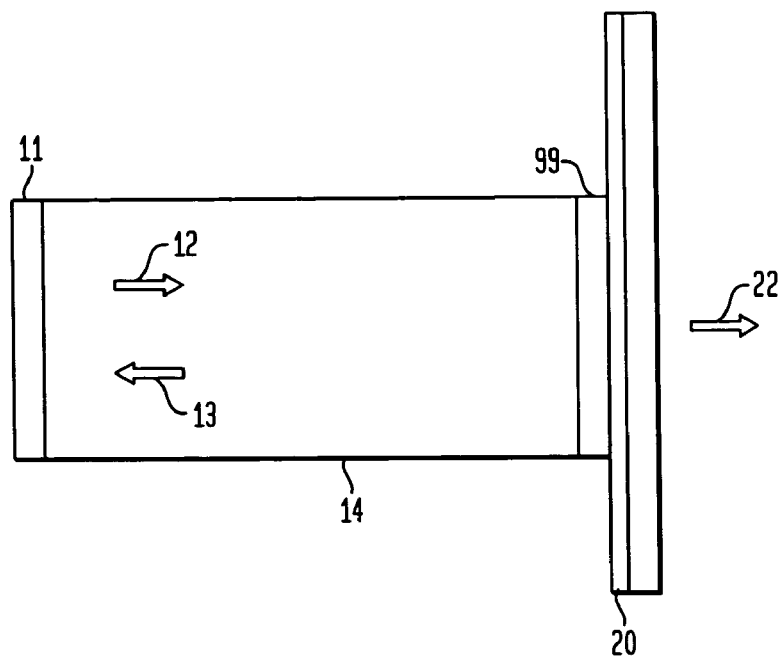
FIG. 2 is an alternative configuration of the laser including an integrated coupling layer.

FIG. 2 describes an alternative embodiment of the laser. In this embodiment, an integrated coupling layer 99 is disposed between the wavelength selective reflector 20 and the gain medium 14.

Figure 3:
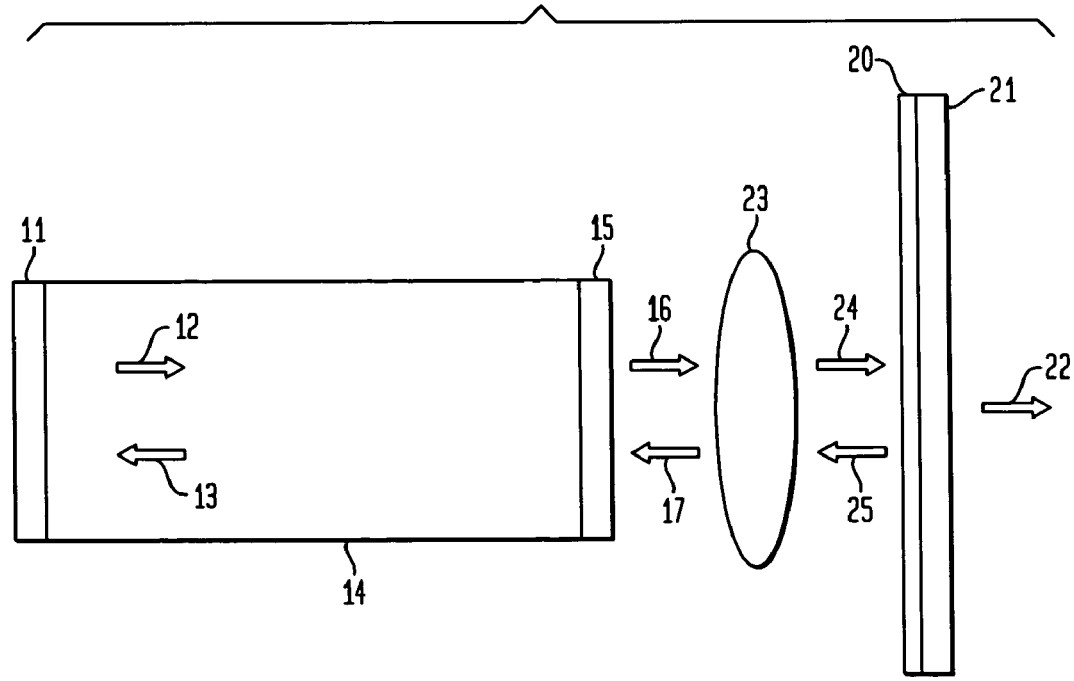
FIG. 3 is an alternative configuration of the laser, in which collimation optics and high reflective coating is used.

FIG. 3 illustrates an alternative embodiment wherein the collimating optics can be a ball or aspheric lens 23. An anti-reflective coating 15 is used at the other laser facet.

FIG. 4 shows alternative embodiment of the laser similar to the arrangement of FIG. 3, except that no high reflective coating is used.

FIG. 5 illustrates an alternative embodiment similar to the arrangement of FIG. 1B, except that no high reflective coating is used.

FIG. 6 shows an embodiment of the invention wherein collimation optics 30 are integrated with the wavelength selecting reflector 14.

FIG. 7 illustrates a tuning technique. The peak wavelength of the subwavelength resonant grating fiber depends on the incident angle. So mounting the grating filter so that it can be tilted permits tuning the wavelength of the beam being reflected. Because the filter is in the proximity of the diode, slight tilting won't lose the coupling: the reflected beam can still be coupled back into the gain medium and amplified. By this way, the lasing wavelength is tuned.

Figure 8:
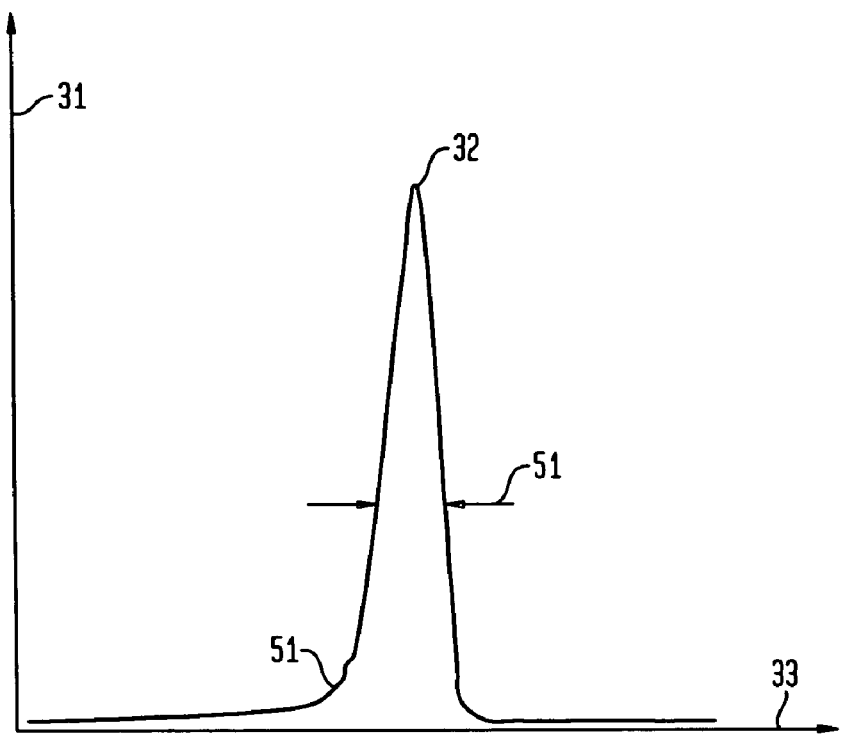
FIG. 8 is the schematic of the reflectance versus the wavelength for a subwavelength resonant grating fiber at normal incidence.

FIG. 8 is the schematic diagram of the reflectance of the grating filter versus the wavelength. Axis 33 denotes wavelength and axis 31 is for reflectance. The peak reflectance 32, the linewidth 51 and the residue reflection 52 are determined by the design and manufacturing process.

Figure 9:
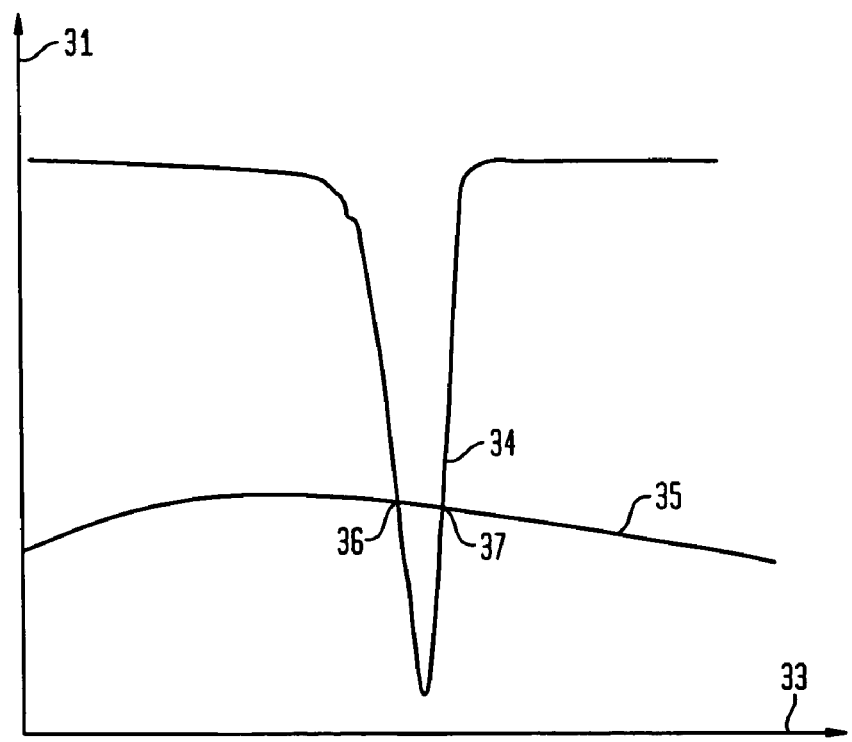
FIG. 9 shows the threshold gain and the medium gain curves of the laser.

FIG. 9 explains the principle of side modes suppressing. Suppose $R_{ref}$ has the wavelength dependence shown in FIG. 8, refer to the formula $$\gamma_{th} = \frac{1}{\Gamma}\left(\alpha + \frac{1}{2d}ln\left(\frac{1}{\eta R_{back} R_{ref}}\right)\right),$$

thereby the wavelength dependence of the threshold gain has a shape shown as 34. Normally small signal gain in a semiconductor laser diode looks like 35, which is flat in frequency domain. Lasing can be possible only when the small signal gain is larger than the threshold gain in a system. So in the case shown here, only mode(s) located between 36 and 37 can possibly lase, while the modes outside of this region are suppressed.

Figure 10:
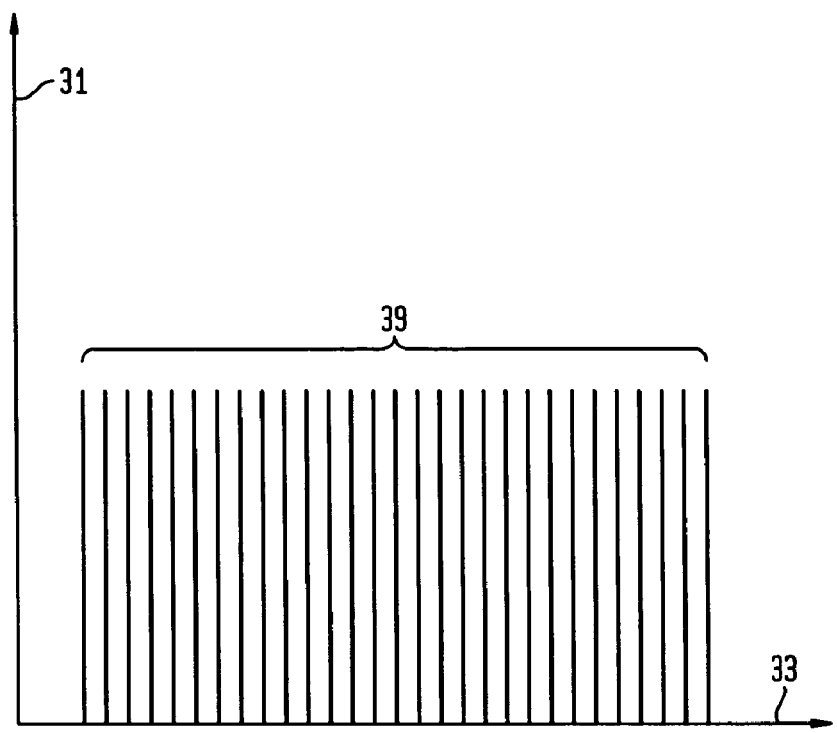
FIG. 10 illustrates the cavity modes of the laser cavity.

FIG. 10 schematically illustrates the cavity modes corresponding to the cavity formed by the front reflector 20 and the back reflector 11. The mode spacing is determined by the cavity length, and the linewidth of each mode is determined by the mode spacing and the reflectance of the reflectors.

Figure 11:
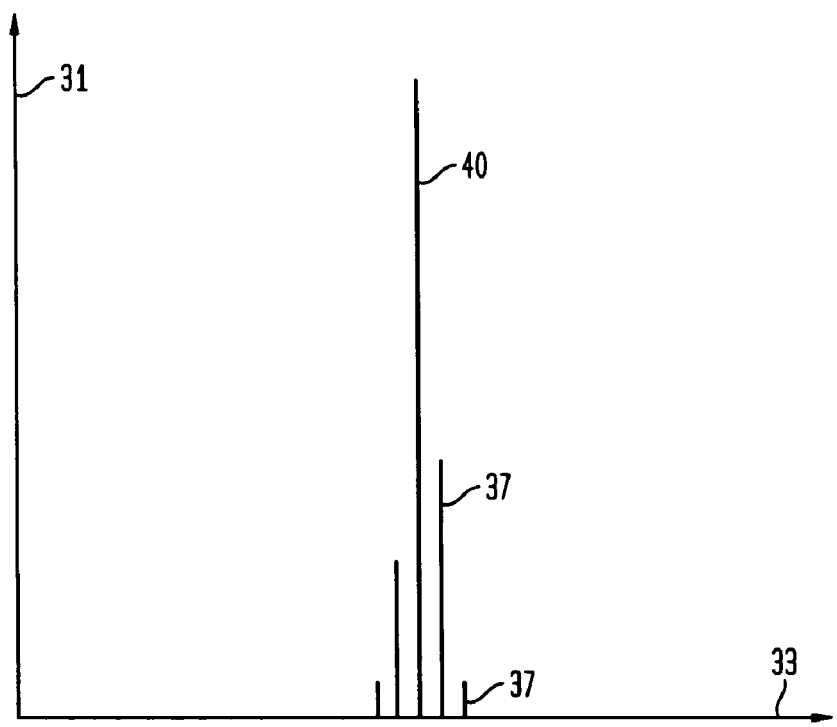
FIG. 11 shows the laser output spectrum of the present invention.

FIG. 11 combines FIG. 9 and FIG. 10 to give a schematic output spectrum of the invention. 40 is the primary mode and 37 are side modes. The ratio of the intensity of the primary mode to that of the strongest side mode is defined as side mode suppression radio.

Figure 12:
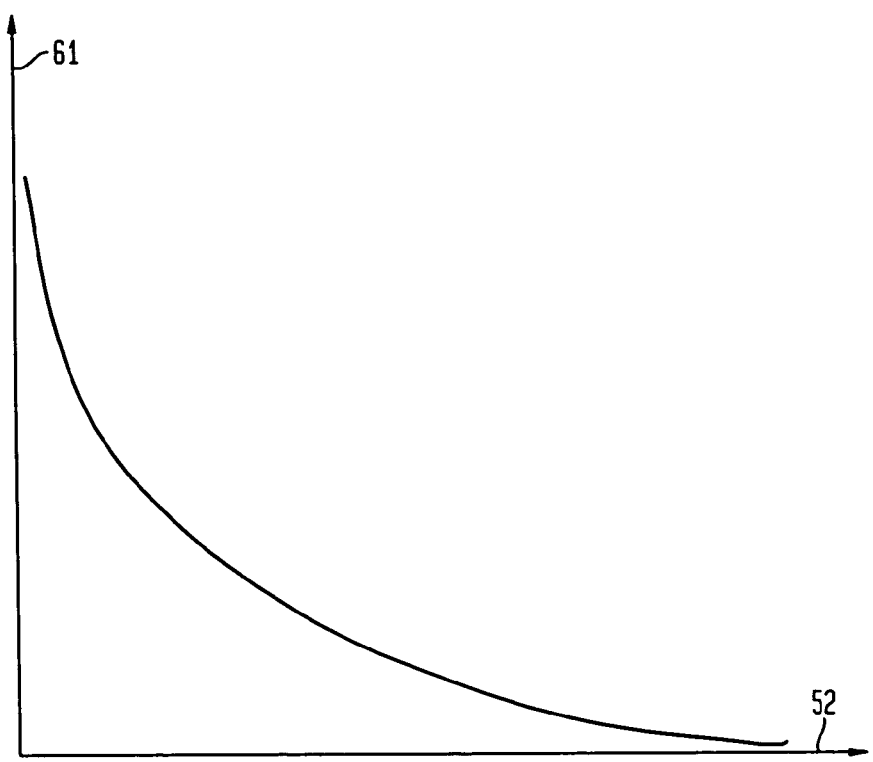
FIG. 12 illustrates the coupling efficiency versus the distance between the reflector and the laser.

FIG. 12 gives the coupling efficiency of the optic mode by the grating reflector illustrated in FIG. 2. The scale of the axis 61 is exponential. This plot indicates that the distance between the 22 and 15 in FIG. 1 has to be very small in order to get enough coupling efficiency.

Figure 13:
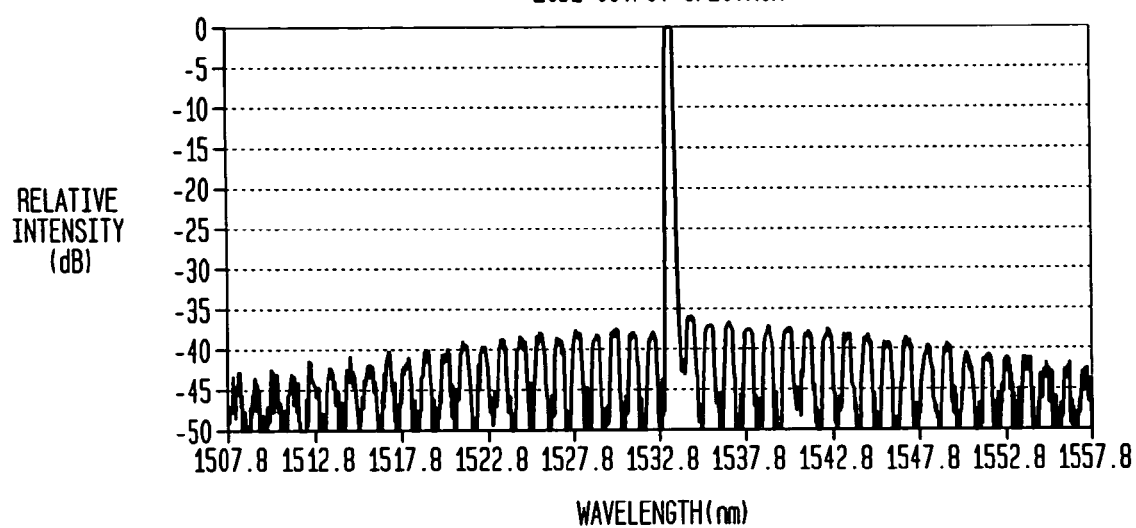
FIG. 13 shows the measured optical spectrum of the output of the laser.

FIG. 13 gives the measured output optical spectrum of the external cavity diode laser. A side mode suppression ratio of 36 dB is obtained. The high performance of this invention is thereby verified.

Figure 14:
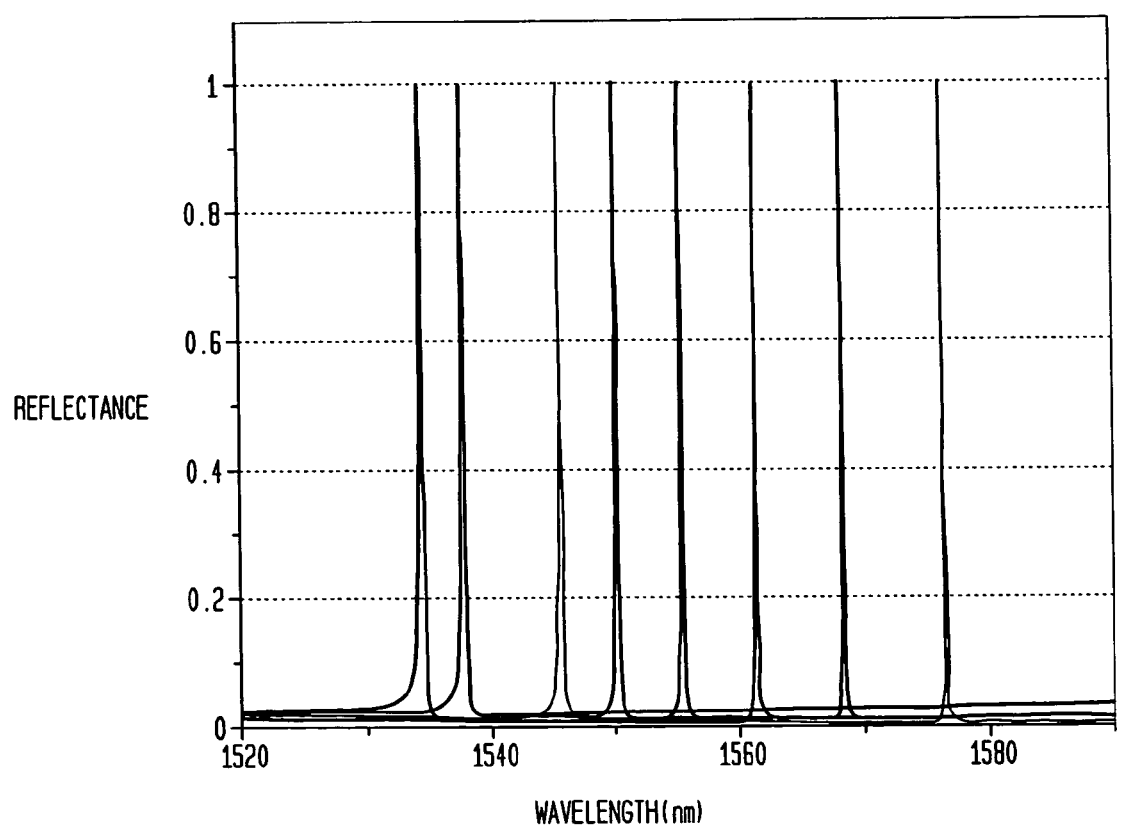
FIG. 14 illustrates the wavelength tunability of a subwavelength resonant grating.

FIG. 14 gives the simulated reflectance of subwavelength resonant grating filter at various voltages applied to it. The peak wavelength can be tuned across a wide range. Since the lasing wavelength of the external cavity diode laser is largely determined by the peak wavelength of the subwavelength resonant grating filter, the external cavity laser wavelength can be tuned accordingly.

FIG. 15 gives the output power versus input current curve for the laser, with and without wavelength selective reflector. With the wavelength selective reflector, the output power is substantially increased and the threshold current is lowered due to the forming of an external cavity for a particular wavelength.

The reflected beam from the front reflector must be coupled back into the gain medium efficiently otherwise there will be no external cavity and single mode operation cannot be achieved. However, the coupling efficiency depends on and is extremely sensitive to the mode matching between the reflected beam mode and the guided mode in gain medium.

Several techniques can be used for collimation to achieve mode matching:

1. A ball lens can be disposed between the front facet and the front reflector. A ball lens has the advantages of simplicity, spherical symmetry, and low cost. Due to the spherical symmetry of a ball lens, the complexity of the optical alignment is significantly reduced.
2. In a high-end system, an aspherical lens can be used as the collimation optics. A specially designed aspherical lens can substantially improve the performance of the laser.
3. The reflector 20 can be disposed directly in front of the front facet of the diode without collimation optics. When the gap between the reflector and the laser diode is sufficiently small, a large fraction of the reflected energy can be coupled back into the gain medium. This configuration tolerates more misalignment than the previous two and therefore permits tunability of the external cavity diode laser, which will be discussed in detail.

Besides mode matching, another major issue is antireflection coating. Since the front facet of the diode is simply cleaved, it normally has reflectance around thirty percent due to Fresnel reflection. This is utilized to form a resonant cavity naturally for a Fabry-Perot Laser. However, this residual reflectance leads to performance degradation for external cavity diode laser, as this reflectance introduces two more sub-cavities. A three-cavity system can easily exhibit chaotic behavior, which degrades the side modes suppression ratio and results in mode hopping. In order to suppress side modes and achieve mode-hop free operation, antireflection coating is deposited on the front facet of the diode. The quality of the antireflection coating is one of the key factors in the performance of an external cavity diode laser.

The peak wavelength of the subwavelength resonant grating filter depends on the incident angle. Therefore, tilting the incident angle to the filter can be used to tune the output wavelength of the external cavity laser. In the configuration in FIG. 5, the filter is in the proximity of the diode, so that there is still enough optical power that gets coupled back into the gain medium even though the filter is tilted. The lasing wavelength is tuned this way without changing any physical properties of the grating filter.

The peak wavelength of the subwavelength resonant grating filter depends on the refractive index and physical thickness of its composing layers, and also on the period of the gratings. It is possible to apply an electrical voltage to the structure to tune the abovementioned parameters. In the configurations of FIG. 1 to FIG. 4, a voltage source connected to the subwavelength resonant grating filter can tune the wavelength of the external cavity diode laser.

Subwavelength resonant grating filters can be divided into two categories: one-dimensional (1-D) gratings and two-dimensional (2-D) gratings. The peak wavelength of 1-D grating filters depends on the polarization of the incident light. In the present invention, polarization of the grating filter must match the polarization of the guided mode of the gain medium if a 1-D grating is used. By using two-dimensional grating structures, this restriction can be overcome.

Subwavelength resonant grating filters can be fabricated by any lithographic techniques, in particular, nanoimprint lithography (NIL), in which a pre-fabricated mold is pressed into a layer of resist, and the patterns are subsequently transferred into the underlying substrate by lift-off and reactive ion etching (RIE). The mold can be fabricated by any lithographic technique, such as photolithography, holographic interference lithography, e-beam lithography, or nanoimprint lithography. In addition, the subwavelength resonant grating filters can be fabricated by any of the abovementioned lithographic process.

The wavelength selective mirrors can be fabricated directly on the diode laser facets.

The foregoing description of the present invention has been directed to particular preferred embodiments. It will be apparent to those skilled in the art, that modifications and changes in both apparatus and method may be made without departing from the scope and spirit of the invention.

What is claimed is:

1. A mode-locked laser comprising:
   a gain medium disposed in an optical resonance cavity, wherein the optical cavity is formed by a first reflector and a wavelength selective second reflector, the second reflector comprising a subwavelength resonant grating formed by a periodic array of spaced apart protruding line or peak features wherein the spacings between the features are less than the wavelength of the light being processed and the width of the line features and all transverse dimensions of the peak features are less than the wavelength of the light; and
   wherein the gain medium comprises a semiconductor laser diode.

2. The laser of claim 1 wherein the subwavelength resonant grating reflector comprises a nanostructure array that is periodic in one dimension.

3. A mode-locked laser comprising:
   a gain medium disposed in an optical resonance cavity, wherein the optical cavity is formed by a first reflector and a wavelength selective second reflector, the second reflector comprising a subwavelength resonant grating formed by a periodic array of spaced apart protruding line or peak features wherein the spacings between the features are less than the wavelength of the light being processed and the width of the line features and all transverse dimensions of the peak features are less than the wavelength of the light; and
   wherein the subwavelength resonant grating reflector comprises a nanostructure array that is periodic in one dimension and the wavelength selective second reflector is adjustably pivotally mounted for permitting tuning of the reflected wavelength.

4. A mode-locked laser comprising:
   a gain medium disposed in an optical resonance cavity, wherein the optical cavity is formed by a first reflector and a wavelength selective second reflector, the second reflector comprising a subwavelength resonant grating formed by a periodic array of spaced apart protruding line or peak features wherein the spacings between the features are less than the wavelength of the light being processed and the width of the line features and all transverse dimensions of the peak features are less that the wavelength of the light;
   wherein the gain medium comprises a semiconductor laser diode having end facets in the laser light path and the wavelength selective second reflector is fabricated directly on one of the laser diode facets.

5. A mode-locked laser comprising:
   a gain medium disposed in an optical resonance cavity, wherein the optical cavity is formed by a first reflector and a wavelength selective second reflector, the second reflector comprising a subwavelength resonant grating formed by a periodic array of spaced apart protruding line or peak features wherein the spacings between the features are less than the wavelength of the light being processed and the width of the line features and all transverse dimensions of the peak features are less than the wavelength of the light; and including collimation optics disposed within the optical cavity.

6. The laser of claim 5 wherein the collimation optics comprise an antireflection coating, and a spherical lens or an aspherical lens.

7. The laser of claim 5 wherein the wavelength reflected by the wavelength selective second reflector is tunable.

8. The laser of claim 1 wherein the first reflector comprises a reflective coating on one end of the semiconductor laser diode.

9. The laser of claim 8 wherein the semiconductor laser diode includes an antireflective coating on the end opposite to that with the reflective coating.

10. The laser of claim 1 wherein the subwavelength resonant grating reflector comprises a nanostructure array that is periodic in more than one dimension.

11. The laser of claim 10 wherein the subwavelength resonant grating reflector comprises a nanostructure array that is periodic in two dimensions.

12. The laser of claim 1 wherein the subwavelength resonant grating selectively reflects a bandwidth sufficiently narrow that the gain medium can laser in only a single mode.

13. The laser of claim 1 wherein the wavelength selective resonant grating is adjustable for permitting tuning of the reflected wavelength.

14. The laser of claim 1 wherein the periodic array is fabricated by nanoimprint lithography.

* * * * *

UNITED STATES PATENT AND TRADEMARK OFFICE
CERTIFICATE OF CORRECTION

| | |
|---|---|
| PATENT NO. | : 7,317,739 B2 |
| APPLICATION NO. | : 10/390379 |
| DATED | : January 8, 2008 |
| INVENTOR(S) | : Stephen Y. Chou et al. |

Page 1 of 1

It is certified that error appears in the above-identified patent and that said Letters Patent is hereby corrected as shown below:

Column 1:
    Line 13: Insert STATEMENT REGARDING FEDERALLY SPONSORED RESEARCH
    skip a line and insert:

The disclosure described herein was sponsored in part by grants from the Defense Advanced Research Projects Agency - Air Force (DARPA-AF), grant N66001-98-1-8900 and Defense Advanced Research Projects Agency - Prime Grant #MDA 972-00-1-0023.

Signed and Sealed this

Twenty-first Day of October, 2008

JON W. DUDAS
*Director of the United States Patent and Trademark Office*